United States Patent
Ose et al.

(10) Patent No.: US 7,315,024 B2
(45) Date of Patent: Jan. 1, 2008

(54) MONOCHROMATOR AND SCANNING ELECTRON MICROSCOPE USING THE SAME

(75) Inventors: Yoichi Ose, Mito (JP); Shunroku Taya, Mito (JP); Hideo Todokoro, Hinode (JP); Tadashi Otaka, Hitachinaka (JP); Mitsugu Sato, Hitachinaka (JP); Makoto Ezumi, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 145 days.

(21) Appl. No.: 11/344,529

(22) Filed: Feb. 1, 2006

(65) Prior Publication Data
US 2006/0219910 A1 Oct. 5, 2006

Related U.S. Application Data

(63) Continuation of application No. 10/751,907, filed on Jan. 7, 2004, now Pat. No. 7,022,983.

(30) Foreign Application Priority Data

Jan. 8, 2003 (JP) ............................. 2003-001686

(51) Int. Cl.
*G21K 7/00* (2006.01)
*G01N 23/00* (2006.01)

(52) U.S. Cl. ............... 250/311; 250/310; 250/305; 250/396 ML (58) Field of Classification Search .................. None
See application file for complete search history.

(56) References Cited

U.S. PATENT DOCUMENTS

| | | | |
|---|---|---|---|
| 5,126,565 A | 6/1992 | Rose | |
| 5,449,914 A | 9/1995 | Rose | |
| 6,040,567 A | 3/2000 | Neher et al. | |
| 6,140,645 A | 10/2000 | Tsuno | |
| 6,239,430 B1 | 5/2001 | Weimer et al. | |
| 6,495,826 B2 | 12/2002 | Tsuno | |
| 2002/0033456 A1 | 3/2002 | Rose | |
| 2007/0138403 A1* | 6/2007 | Cubric et al. | 250/396 ML |

FOREIGN PATENT DOCUMENTS

| | | |
|---|---|---|
| DE | 196 33 496 A1 | 2/1998 |
| DE | 100 20 382 A1 | 10/2001 |
| JP | 59-143252 | 8/1984 |

(Continued)

*Primary Examiner*—Jack I. Berman
*Assistant Examiner*—Zia R. Hashmi
(74) *Attorney, Agent, or Firm*—Dickstein Shapiro LLP (57) ABSTRACT

An invention providing a scanning electron microscope composed of a monochromator capable of high resolution, monochromatizing the energy and reducing chromatic aberrations without significantly lowering the electrical current strength of the primary electron beam. A scanning electron microscope is installed with a pair of sectorial magnetic and electrical fields having opposite deflection directions to focus the electron beam and then limit the energy width by means of slits, and another pair of sectorial magnetic and electrical fields of the same shape is installed at a position forming a symmetrical mirror versus the surface containing the slits. This structure acts to cancel out energy dispersion at the object point and symmetrical mirror positions, and by spatially contracting the point-converged spot beam with a converging lens system, improves the image resolution of the scanning electron microscope.

17 Claims, 12 Drawing Sheets

FOREIGN PATENT DOCUMENTS

| | | |
|---|---|---|
| JP | 4-233145 | 8/1992 |
| JP | 7-37536 | 2/1995 |
| JP | 11-191384 | 7/1999 |
| JP | 11-195396 | 7/1999 |
| JP | 2001-357809 | 12/2001 |
| JP | 2003-132828 A | 5/2003 |

* cited by examiner

Toroidal coefficient: C1=R2/Ry

| Parameters | L1 | R1 | θ1 | L2 |
|---|---|---|---|---|
| Relative dimensions | -0.0123 | 0.010 | 160° | 0.011 |

| Parameters | R2 | θ2 | L3 | C1 |
|---|---|---|---|---|
| Relative dimensions | 0.022 | 160° | 0.012 | 0.55 |

(A) Adjust position of actual focus point 18

(B) Adjust excitation of magnetic field 21

(C) Adjust voltage of electrical field 22

(D) Apply voltage of electrical field 23

(E) Adjust position of ghost image point 18

(F) Adjust position of beam restrictor 24

Toroidal constant: C1=R2/Ry

FIG. 11

| Parameters | L1 | R1 | θ1 | L2 |
|---|---|---|---|---|
| Relative dimensions | −0.0100 | 0.0086 | 160° | 0.010 |

| Parameters | R2 | θ2 | L3 | C1 |
|---|---|---|---|---|
| Relative dimensions | 0.022 | 160° | 0.0089 | 0.60 |

MONOCHROMATOR AND SCANNING ELECTRON MICROSCOPE USING THE SAME

CROSS REFERENCE TO RELATED APPLICATIONS

The present application is a continuation of U.S. application Ser. No. 10/751,907, filed Jan. 7, 2004, now U.S. Pat. No. 7,022,983, the disclosure of which is herewith incorporated by reference in its entirety.

FIELD OF THE INVENTION

The present invention relates to a monochromator for making the energy of an electron beam monochrome and a scanning electron microscope having the same.

BACKGROUND OF THE INVENTION

In recent years, the scanning electron microscope in many cases utilizes a low acceleration energy within a few kilovolts to prevent the electron beam from generating an electrostatic charge on the semiconductor sample. In these types of low acceleration SEM (scanning electron microscopes), the characteristic energy width of the electron source for the acceleration energy becomes relatively large so chromatic aberrations prevent obtaining an electron beam with a sufficiently small spot.

To solve this problem, technology utilizing an energy filter to selectively allow only electrons in the desired energy range to pass was disclosed in patent documents 1 through 5.

Patent document 1 discloses technology for reducing the chromatic aberrations by installing a magnetic field type energy filter between the electron source and the objective lens. This technology combines a magnetic sector field for lateral beam input/output, with a non-dispersive point (achromatic state) used as a crossover, along with an iris (beam limiter) installed at the beam convergence point along the linear optical axis of the beam emitted from the electron source.

The technology disclosed in patent document 2 utilizes a double structure Wien filter (overlapping magnetic field and electrical field) to monochromatize the electron beam, disperse the energy of the electron beam and select energy electrons with a single slit plate (FIG. 5 and FIG. 6 of patent document 2). The technology shown in FIG. 10 of patent document 2 discloses a monochromator composed of four magnetic sector fields. In this technology, after monochromatizing the electron beam with a slit installed downstream of two prestage magnetic sector field filters, the electron beam was non-dispersively converged by two final stage magnetic sector field filters.

The technology disclosed in patent document 3 describes an energy filter (monochromator) utilizing four semispherical electric deflectors (spherical electrical fields) and having slits in the mirror symmetrical surfaces midway between those deflectors. The beam emitted from the electron gun is subjected to energy dispersion by two prestage spherical electrical sector fields. Then, the energy width is reduced by the slits, the beam is non-dispersed by passing through two final stage spherical electrical sector fields, and a crossover is formed.

The technology disclosed in patent document 4 is not a monochromator but utilizes a Ω-type magnetic field filter installed in the projector lens system of a transmittance type electron scanning microscope. This energy filter further contains a linear path for the electron beam when not analyzing energy, and is further designed not to change the excitation of the front-rear lens.

The technology disclosed in patent document 5 is also not a monochromator and instead utilizes an energy filter composed of three sectorial magnets. One magnetic field is a uniform magnetic field for lateral input/output beam emission and works in combination with other non-uniform magnetic fields for energy selection.

Patent document 1:
  JP-A No. 195396/1999

Patent document 2:
  JP-A No. 357809/2001

Patent document 3:
  JP-A No. 233145/1992

Patent document 4:
  JP-A No. 191384/1999

Patent document 5:
  JP-A No. 37536/1995

SUMMARY OF THE INVENTION

The patent documents 1 through 5 disclosing monochromator and energy filters with an overlapping magnetic field and electrical field (patent document 2), a magnetic field (patent documents 1, 2, 4, 5) and an electrical field (patent document 3) had the following problems.

The energy filter using a magnetic field to perform filtering had the problem that when attempting to obtain secondary beam convergence by lateral irradiation onto the magnetic pole surface, secondary chromatic aberrations occurred and the scanning beam could not be sufficiently narrowed, resulting in poor resolution.

However, on monochromators that perform secondary convergence (or focusing) by a using semispherical electrical field, a semi-spherical condenser electrode must be installed along the linear optical path of the electron beam. So using a high-sensitivity scanning electron microscope without a monochromator requires that holes for these electrodes be drilled in the electrode along the optical axis of the electron beam (or the electron beam trajectory emitted from the electron source when not deflected by a deflector of an electron beam, which is hereinafter referred to as a "linear optical axis"). When used as a monochromator however, these cause distortions in the electrical field distribution that makes it impossible to sufficiently converge the electron beam.

In comparison with the technology disclosed in patent documents 1, 3, 4, and 5, the monochromator with Wien filter disclosed in patent document 2 had such a problem that when the dispersion is to be enlarged, the optical axis of the electron beam becomes long, and resolution deteriorates due to a drop in vibration resistance.

An object of the present invention is therefore to provide a monochromator and a scanning electron microscope using that monochromator capable of high resolution, by suppressing higher-order aberrations, without causing a drop in beam convergence.

To achieve the above objects, the present invention proposes a monochromator, and a scanning microscope utilizing that monochromator for deflecting the electron beam from the optical beam linear optical axis by using sectorial magnetic fields, and dispersing the energy of the beam and allowing electron passage through a slot. The specific structure, application and effect of the present invention are explained next in the detailed description of the preferred embodiments.

DETAILED DESCRIPTION OF THE INVENTION

The embodiment of the present invention described next is capable of deflecting a magnetic field to make an electron beam travel along an optical axis, and deflecting an electron beam away from an optical axis; and combined with electrical field deflection is capable of focusing a beam perpendicular to the electron beam deflection direction without generating higher-order aberrations.

First Embodiment

The optical system and optical system operation for the scanning electron microscope containing a monochromator of the first embodiment of the present invention is described next while referring to FIG. 1.

When a voltage is applied across an electron source 1 and anode electrode 2, an electron beam 3 is emitted from the electron source 1 along the linear optical axis. This electron beam 3 also includes an electron beam 3a widening to several dozen millirads, coupling the actual image of the electron source to an internal section of the monochromator 20 with a first convergence lens 4. The electron beam is then deflected in a range of 140 degrees or more and 170 degrees or less, by a magnetic field generator 21 of the prestage deflector system, and by deflecting to the same angle in the opposite direction by a first electrical field generator 22, the beam is placed in a direction parallel to the original linear optical axis, focused at the slits 24 position in the x direction (left and right on paper surface) and energy selection performed.

A non-dispersed ghost image is then formed to cancel out the energy dispersion generated in the prestage deflection system. This ghost image is formed by a second electrical field generator 23 in the final stage deflection system installed at a position symmetrical to the surface containing slits for deflecting the electron beam to return to the linear track of the electron beam, and by point convergence by the magnetic field generator 21 along a mirror symmetrical trajectory. This monochromatized ghost image of the electron source is formed into an image by a second conversion lens 6 and then reduced by an objective lens 8, to form a tiny crossover on the surface of a sample 9.

The angle opening of the primary electron beam 3 or amount of beam current is restricted by a beam limiter 5 installed downstream of the monochromator 20. This electron beam 3 is further two-dimensionally scanned on the sample 9 by the scanning coil 7 (deflector). The magnetic field generator and electrical field generator comprising the monochromator 20 are preferably formed so that the electrons form a fan shape widening along the electron beam path.

The electrons 10 (secondary electrons, and/or reflected electrons) emitted from the sample, rise while receiving the effect from the objective lens 8. These electrons 10 rise and strike the conversion electrode 11 and generate new secondary electrons 12. These secondary electrons 12 strike the scintillator 13 applied with a positive high voltage and emit light. After these electrons are converted into electrical signals and amplified by a photomultiplier tube, they can be observed as a microscope image (SEM image) on the cathode ray tube. The embodiment described in FIG. 1, employed a technique that converted electrons emitted from the sample into secondary electrons with a conversion electrode and then detected these electrons with a detector. However, the invention is not limited to this example and electrons emitted from the sample may for example be supplied directly to a detector.

Figure 1:
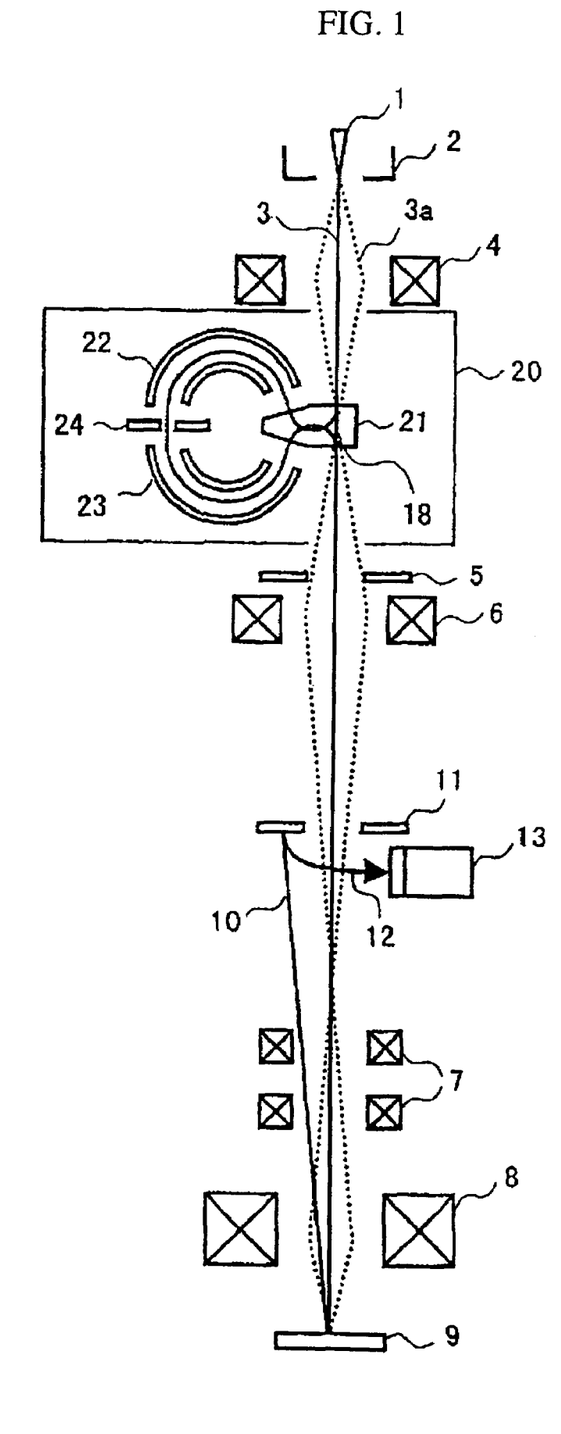
FIG. 1 is a drawing for describing the scanning optical microscope comprising the monochromator of the embodiment of the invention.

The optical devices described with FIG. 1 are connected to a control device not shown in the drawing. This control device adjusts the voltage and the electrical current applied to each optical element (or device).

The track of the electron beam of the electro-optical system for the monochromator in the following embodiment is next described in detail while referring to FIG. 2 through FIG. 4.

Figure 2:
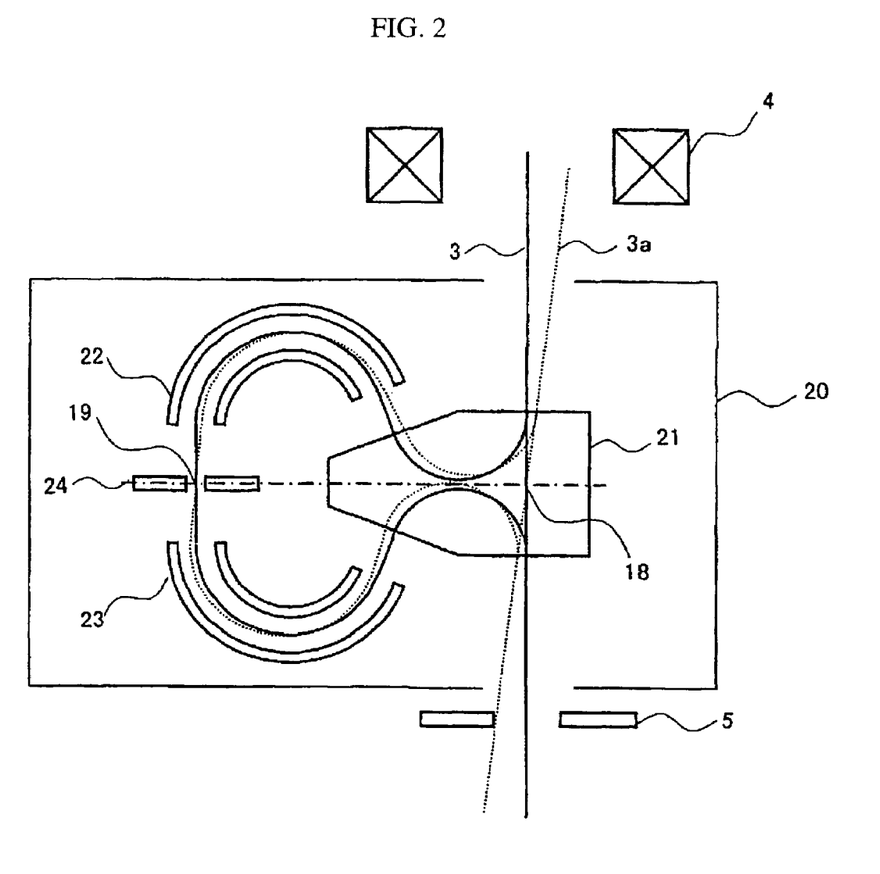
FIG. 2 is a drawing for describing the track in the x direction of the electron beam within the monochromator.

FIG. 2 shows the electron beam 3a widening in the radial (x direction) after deflection by electron beam 3 in the monochromator 20. The monochromator 20 is composed of flat surfaces that have mirror symmetrical upper and lower flat surfaces (or two-fold symmetry) containing the slits 24.

The drive (excitation) of the first focus lens 4 is adjusted and the electron beam 3 beam is input to couple the actual image of the electron source at the crosspoint with the mirror symmetrical surface 18 and electron beam 3. The beam is initially deflected approximately 160 degrees by driving the magnetic field generator 21. The actual image is present along this deflection trajectory. The beam next passes through the drift space and is next deflected one time at an identical angle in the opposite direction by the first electric field generator 22, and is converged in the x direction onto the slit 24 position. The beam is then made to travel along a symmetrical track by the magnetic field generator 21 and second electric field generator 23 of the final stage deflector system installed on mirror symmetrical positions versus the surface containing the slits 24. The beam then disperses outward after being emitted from the magnetic field generator 21. A ghost image however is formed on the mirror symmetrical surface 18 by the emitted electron beam 3 as seen from the beam limiter 5.

The magnetic field generator 21 of the present embodiment is formed from two magnetic poles arrayed at perpendicular intervals on the paper. By forming magnetic fields along a direction from the closer edge to the farther edge of the paper (away from the closest side) between these two magnetic poles, (in a direction perpendicular to optical axis of electron beam), the electron beam is deflected towards the left side of the paper surface.

The input/output beam surface of the sectorial magnetic generators is set largely perpendicular to the electron beam. There is no focusing effect (y direction) on the direction the magnetic lines of force are facing.

The example given in this embodiment described the magnetic pole deflecting the electron beam outside the linear optical axis, integrated with another magnetic pole for returning the beam to the linear optical axis after it has passed the second electrical field generator. However, the present invention is not limited to this example and deflection may be performed using respectively different magnetic poles.

The device of the present embodiment can be utilized as a normal scanning electron microscope that does not monochromatize the electron beam and therefore comprises a means to turn the drive (excitation) to the magnetic field generator 21 on and off, as well as a means to erase the residual magnetic fields.

Figure 3:
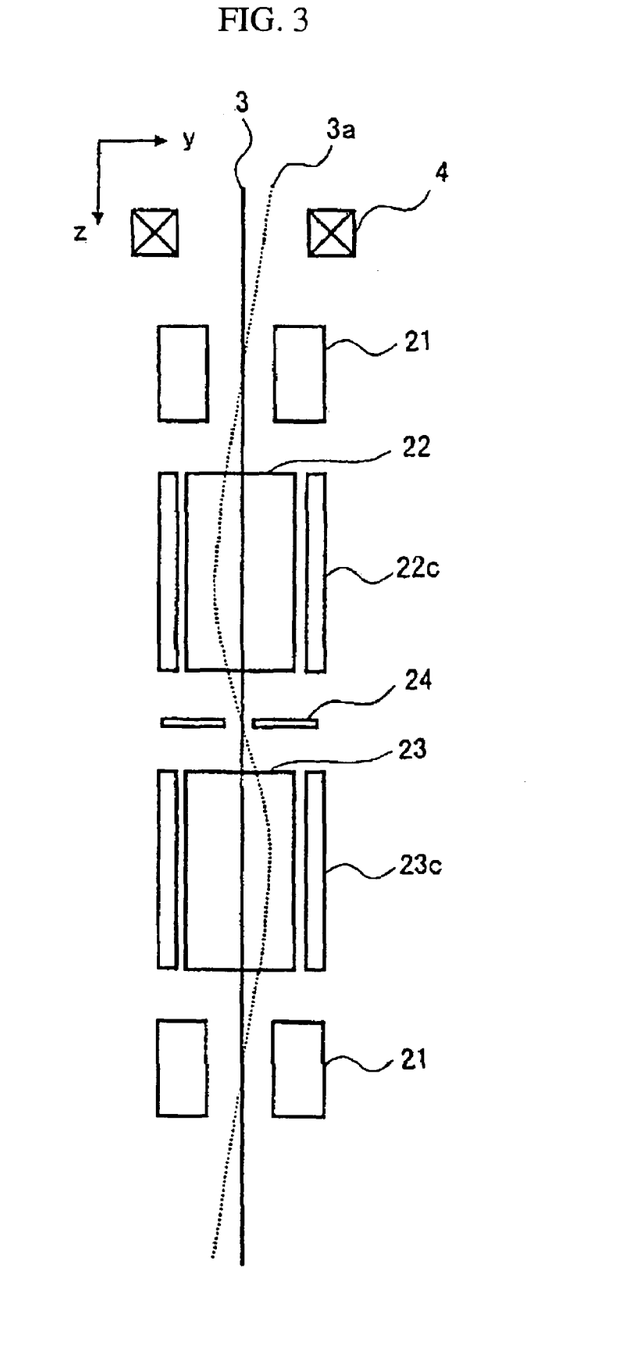
FIG. 3 is a drawing for describing the track in the y direction of the electron beam within the monochromator.

FIG. 3 shows the widening electron beam in the perpendicular direction (y direction) of the paper of FIG. 2 converted to a straight line extending along a curved trajectory in the z direction. Because the electron beam 3 is perpendicularly beamed into and out of all the sectorial magnetic fields, there is no convergence effect when being beamed inwards or outwards. However, by forming the electric field generator as a toroidal electrical sectorial field, a converging effect is generated in the y direction. First of all, the widened electron beam 3a is focused by the first converging lens 4, and converged in the y direction along the deflection track of the fan shaped magnetic field sectors formed by the magnetic field generator 21. The beam transits the drift space, and passes the electrical field formed by the first electrical field generator 22, simultaneously point-converging in the x direction at the slit 24 position. The electron beam 3 that passed through the slits 24 is formed in a mirror symmetric electron trajectory by the electrical field formed by the second electrical field generator 23, and by the magnetic field formed by the magnetic field generator 21 that were installed mirror symmetric to each other.

In the present embodiment, using a toroidal electrical field formed by a sectorial toroidal electrode for converging in the y-direction is effective in suppressing the generation of higher-order aberrations, compared to the case where lateral beam input/outputs of the sectorial magnetic field are converged in the y direction.

In other words, converging the beam in the y direction by using an ordinary sectorial magnetic field, utilizes the effect generated from laterally irradiating an electron beam onto or from the plane of a magnetic field with sudden changes in the input beam surface (incidence plane) or output beam surface. Converging the beam in this way therefore creates secondary aberrations involving the widening beam angle. In the present embodiment, however, the y axis convergence effect is attained only by using a toroidal electrical field so that the electron beam can be perpendicularly irradiated onto or from a magnetic deflector device and the generation of secondary aberrations can therefore be suppressed.

The magnetic field generator of the present embodiment is composed of a first input surface for inputting an electron beam from the linear optical axis, a first output surface for emitting the electron beam input from the first input surface, a second input surface for inputting the electron beam deflected by the second electric field generator 23, and a second output surface for emitting the electron beam input from the second input surface, along the linear optical axis.

Also in this embodiment, the electron beam is deflected from the linear optical path by using sectorial magnetic fields. Compared to deflection using a sectorial electrical field, the dimensions along the linear guide can be shortened when deflecting with a sectorial magnetic field. In other words, in order for sectorial electrodes to be installed along the electron beam path, the electron beam path is required to be separated into energy filter prestages and latter stages. Sectorial magnetic fields are, however, not subject to this limitation and can be brought into proximity with the shuttling electron beam or crossed as shown in FIG. 1, and the height of the device can be lowered, then the shaking resistance can be improved and better image resolution achieved.

Figure 4:
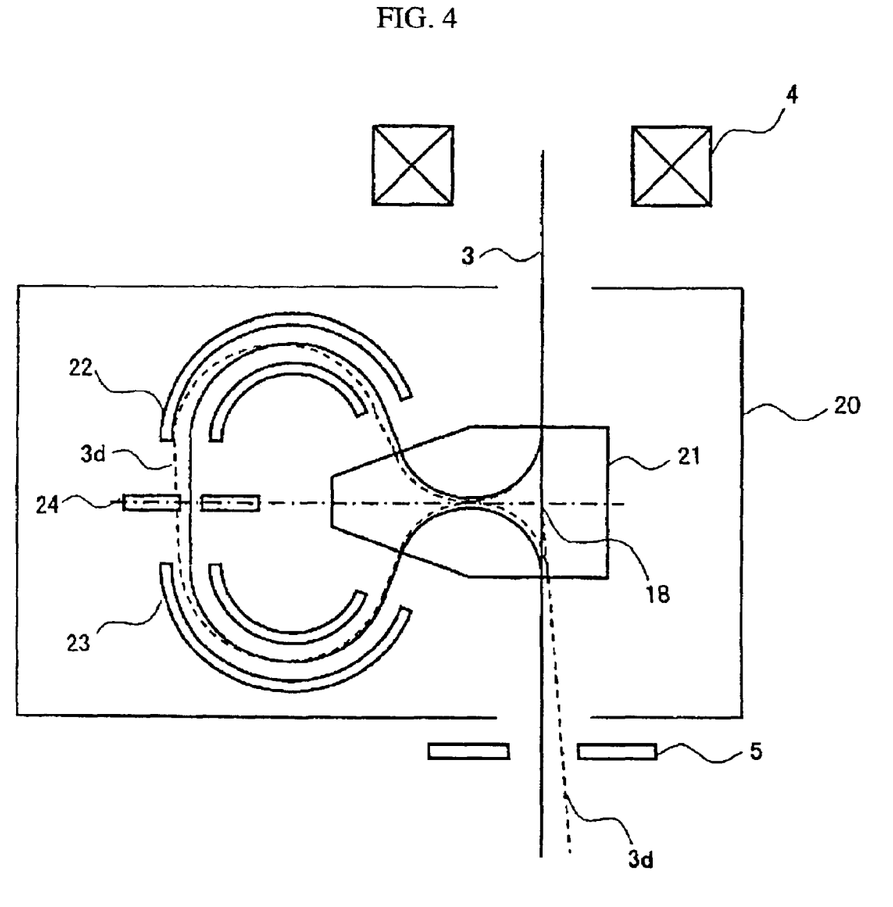
FIG. 4 is a drawing for describing the energy dispersion trajectory of the electron beam within the monochromator.

FIG. 4 shows the energy dispersion trajectory 3d. The energy dispersion trajectory 3d is emitted at the point of beam input from the sectorial magnetic field by the magnetic field generator 21, passes through the first sectorial toroidal electrical field generated by the first electrical field generator 22 and reaches a maximum in the vicinity of the slit 24.

The energy dispersion trajectory 3d beam then using a mirror symmetrical trajectory, and energy dispersion diminishes and becomes zero in the ghost image of the electron beam 3d emitted from magnetic field generator 21 on the mirror symmetrical surface 18 as seen from the beam restrictor 5. In summing up the above, point convergence and triple convergence of the non-dispersed energy (dispersion is zero) are achieved in the ghost image.

A trajectory calculation program called, TRIO (T. Matsuo, H. Matsuda et al.; Computer Program "TRIO" for Third Order Calculation of Ion Trajectory, Mass Spectrometry 24 (1976), pp. 19-62) was used to calculate the convergence characteristics of this monochromator. The parameters are defined in FIG. 5. The distances in the drift space are L1, L2, L3, the deflection path radius in the electrical field and magnetic fields are R1, R2 and the deflection angles are θ1, θ2. In the monochromator of the present invention, the mirror symmetrical surface is set as a two-fold (upper/lower) symmetry. If a monochromator is designed with each parameter having the same ratios as above then its performance will be the same as this embodiment.

When the size (object point) of the actual image as seen from the beam input side, or in other words, when the size of the electron beam ($x_1$, $y_1$) is small enough to be ignored then, when the widening beam angles are α and β, and the energy width was set as δ (=ΔE/E), the beam width $x_2$ in the x direction, and the beam width $y_2$ in the y direction after passing through the monochromator lens system are expressed by the following quadratic formulas.

$$x_2 = A^*\alpha + D^*\delta + AA^*\alpha^2 + BB^*\beta_2 \quad (1)$$

$$y_2 = B^*\beta + AB^*\alpha\beta \quad (2)$$

Figure 5:
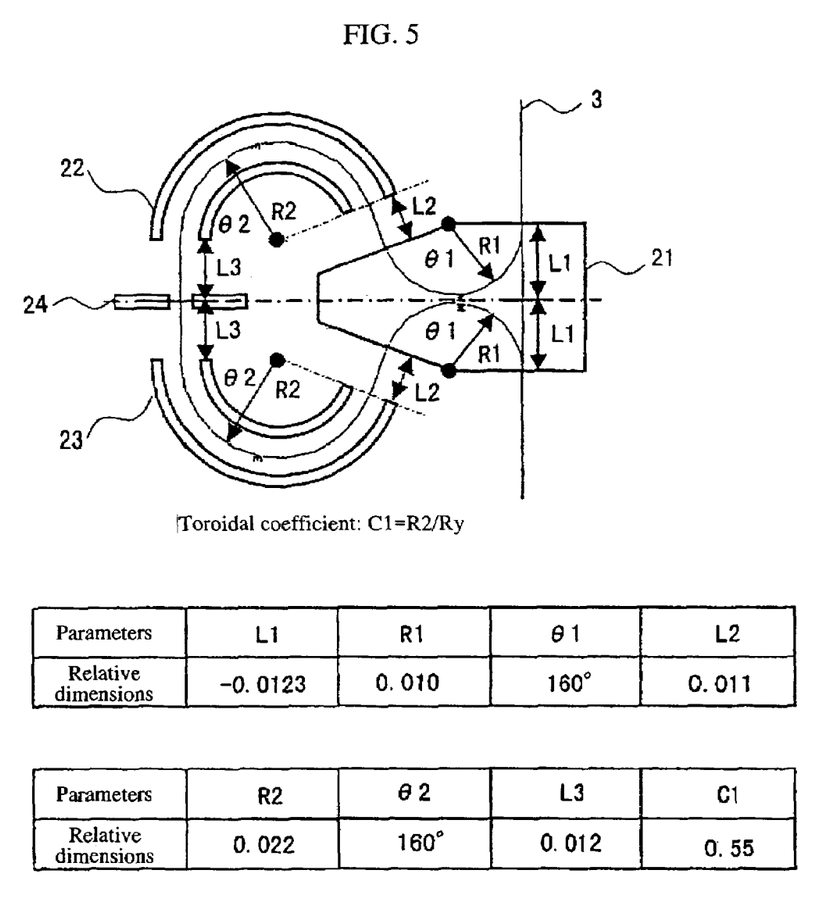
FIG. 5 is a drawing for describing the electro-optical parameters.
Figure 6:
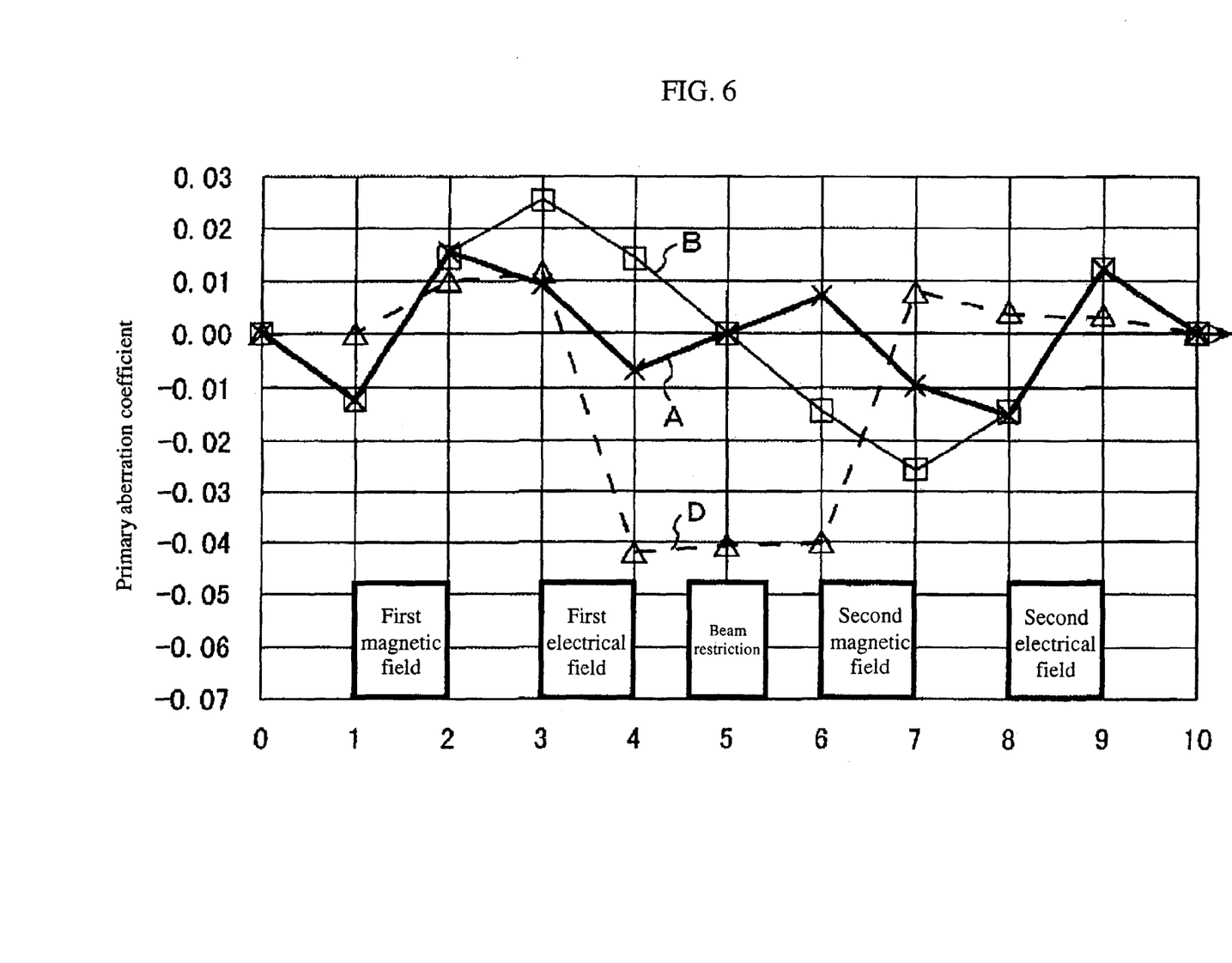
FIG. 6 is a graph showing the primary aberration coefficient of the monochromator.
Figure 7:
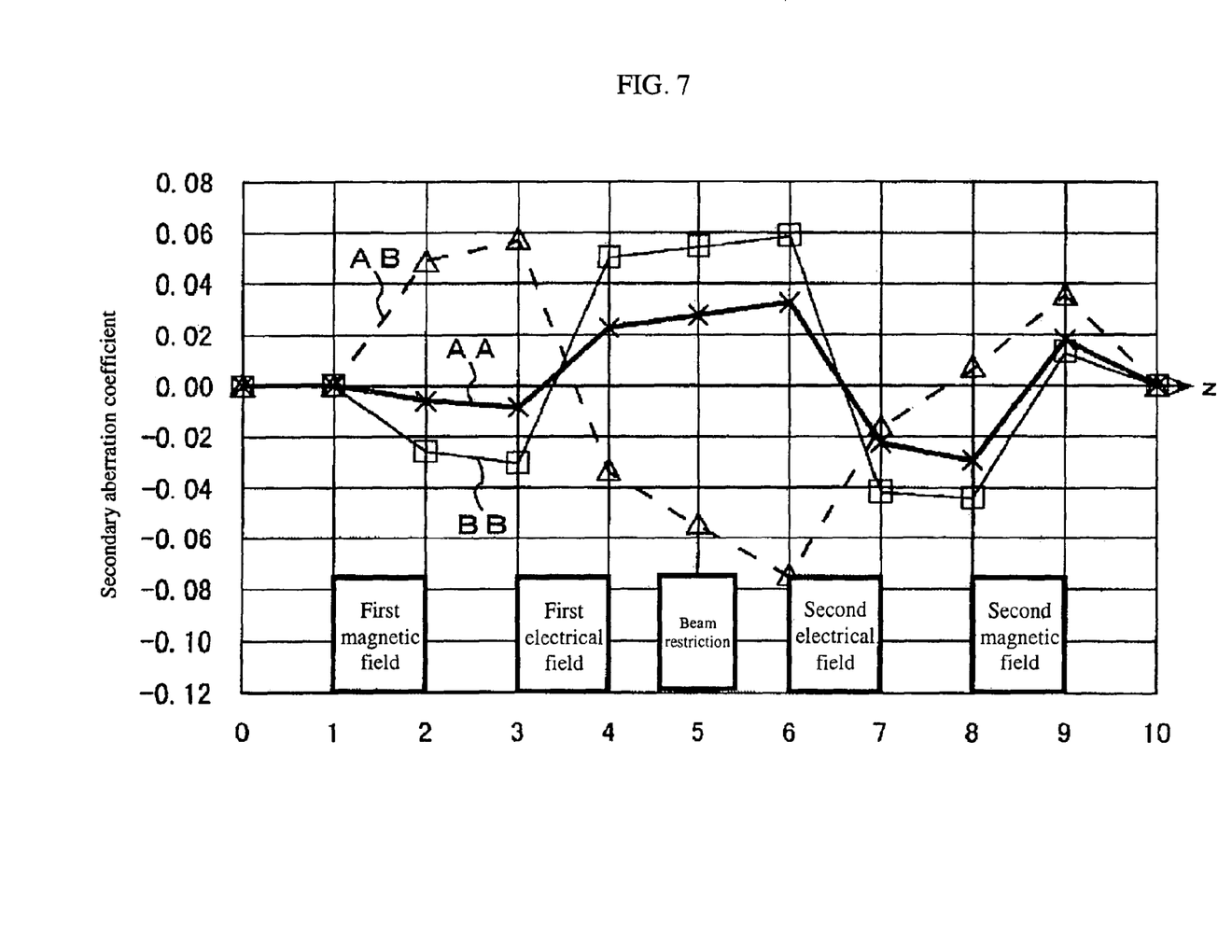
FIG. 7 is a graph showing the secondary aberration coefficient of the monochromator.

Here, A is the x-direction aberration coefficient, B is the y-direction aberration coefficient, D is the energy dispersion coefficient, AA, BB, AB are respectively secondary aberration coefficients relating to the open angle of the beam spaces. When the above parameters with the values in the boxes at the lower part of FIG. 5 are established as the specific embodiment of the present invention, the changes in the primary aberration coefficients and secondary aberration coefficients are shown in FIG. 6 and FIG. 7. The horizontal axis indicates the progression direction of the z axis. The left end (0) in the figure is the theoretical object point for the beam input side, and the right end (10) is the ghost image point on the beam output side. In other words, the right end (10) is the monochrome convergence point.

As clearly shown in FIG. 6, with the aberration coefficient A for the x-direction open angle α, and the aberration coefficient B for the y-direction open angle β simultaneously converging (A=B=0), the energy dispersion coefficient D reaches −0.04. The x-direction and y-direction simultaneously converge on the monochrome convergence point at the right end (10), moreover the dispersion is canceled out. In this way, in the primary formula for the trajectory calculation, the monochromator of the present invention is triple-converged (A=B=D=0) both in terms of space and energy.

In the secondary aberration coefficient of FIG. 7, the three secondary aberration coefficients have been eliminated at the right end monochrome convergence point (AA=BB=AB=0). This is the effect of mirror symmetry at the monochromator slit position, and perpendicular input of the beam to the plane of the sectorial magnetic field.

As described above, if the monochromator of the present invention is installed below the first focus lens of the scanning electron microscope, all of the monochrome convergence points converged using the primary and secondary aberration coefficients A, B, D, AA, BB, AB can be obtained after limiting the beam energy at the slits. These are set as object point for the second focus lens, and by contracting (the focus point) with the objective lens, an extremely small spot with few chromatic aberrations can be obtained and the resolution of the scanning electron microscope improved.

Figure 8:
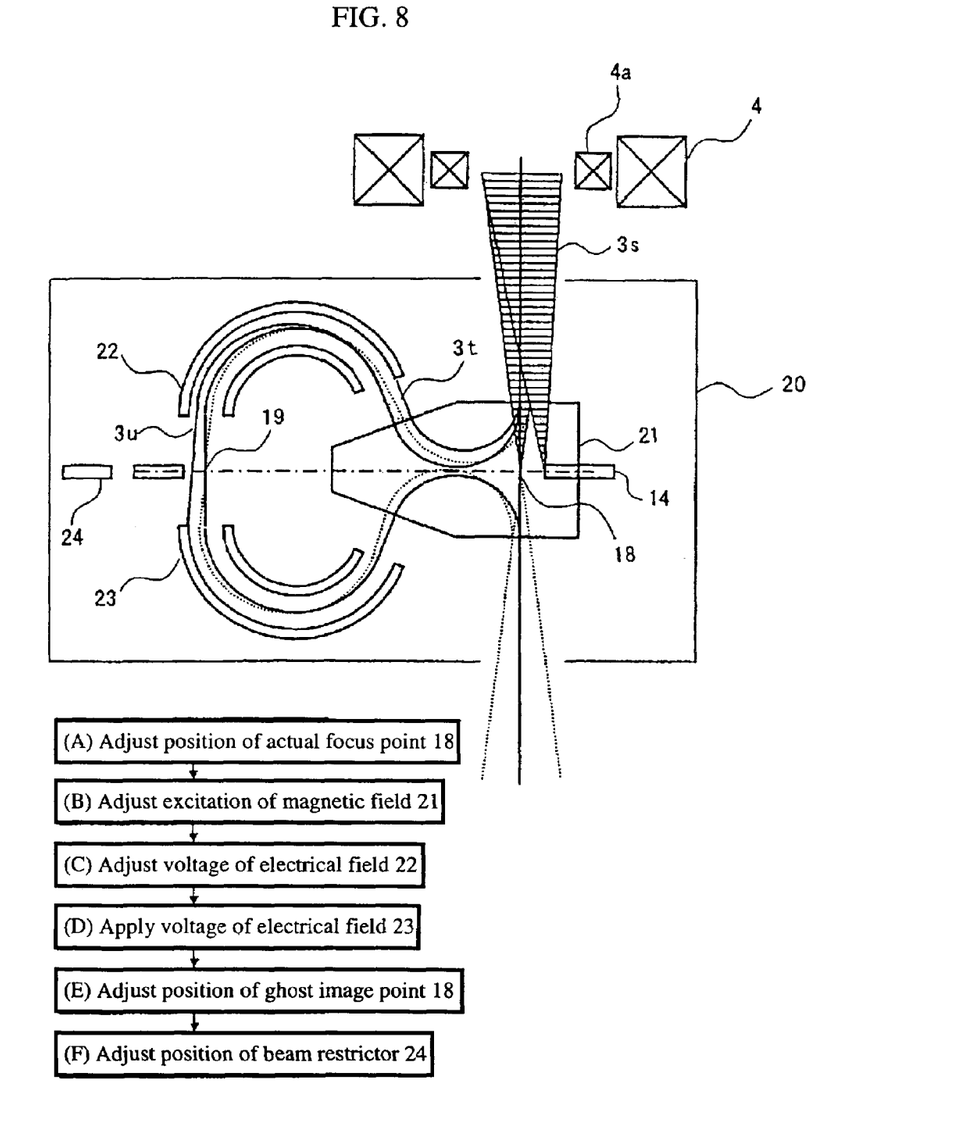
FIG. 8 is a drawing showing the focus point adjustment method for the monochromator.

The method for adjusting the monochromator of the present invention is described next while referring to FIG. 8.

(A) First of all, the drive (excitation) of magnetic field generator 21 on the monochromator 20 is cut off and an actual image of the electron source is formed on the mirror symmetric surface 18. A beam restrictor 14 with a diameter of approximately 500 micrometers is installed for that purpose. By then using the adjustment scanning coil 4a to perform two-dimensional scanning with electron beam 3s with this beam restrictor 14, a condensed SEM image can be acquired, and an actual image obtained under optimal image resolution conditions. Adjusting the second focus lens and objective lens with these conditions allows optimizing the SEM image resolution of the sample.

(B) Next, as the drive (excitation) of the magnetic field generator 21 is successively amplified, an electron beam 3t is irradiated onto the electrode of a first electrical field generator 22 only when the drive or excitation is within a certain range. By setting the excitation current of magnetic field generator 21 to an intermediate value for the current flowing into the external electrode, it is possible to make adjustments based on accurate, optimal excitation conditions.

(C) The electron beam 3u is irradiated onto the electrode of a second electrical field generator 23 when the voltage of the first electrical field generator 22 is increased. By measuring the electrical current flow into the external electrode, it is possible to find the conditions needed for applying a voltage for irradiating the center of the gap of the second electrical field generator 23 with an electron beam. This enables to make adjustments based on accurate voltage application conditions the same as when adjusting the sectorial magnetic field.

(D) Set the second electrical field generator 23 to the same voltage conditions as the first electrical field generator 22.

(E) Compare with the SEM image of the sample in (A), and make fine adjustments to the voltage of the first electrical field generator 22 and second electrical field generator 23 to minimize defocusing or image shifting.

(F) Insert a beam restrictor 24 up to the crossover 19 of the electron beam. Make fine adjustments using the scanning coil 4a so that beam restrictor 24 is in the center of the image.

Figure 9:
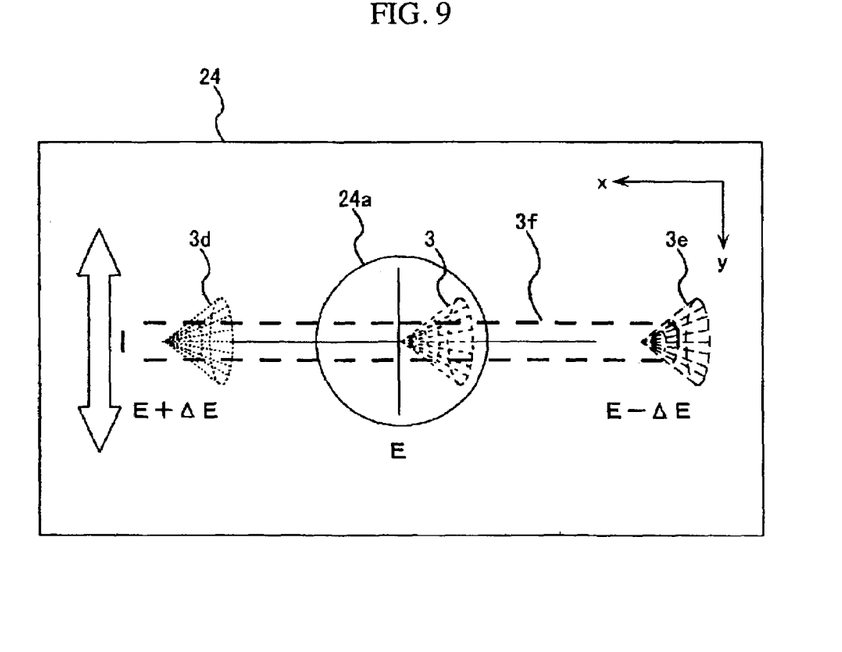
FIG. 9 is a drawing for showing the beam shape on the mass separator slit.

The reference numerals 3, 3d and 3e in FIG. 9 represent results calculated for beam shape using TRIO under the conditions for focusing the electron beam at the beam restrictor 24 position. A beam shape with a wide energy width is a dispersion image such as represented by 3f. Although the constriction in beam width in the y direction is small relative to a hole of approximately 4 micrometers, a widening effect occurs in the x-direction due to the diffusion of energy, making it impossible to observe clear and sharp focused image. There is, however, little change in energy dispersion due to focus adjustment so fine adjustments may be made to the sectorial toroidal electrical field under the condition that the lateral width of the entire image is minimum. Finally, check that the monochrome point on the mirror symmetric surface 18 matches the actual image formed prior to excitation by the sectorial magnetic field of the magnetic field generator 21 as seen from the output slit of monochromator 20. This method makes the optical conditions downstream of the monochromator completely identical, and fine adjustments made to the second electrical field generator 23 parameters prevent image shifts and defocusing from occurring before or after excitation of the magnetic field generator 21.

Figure 10:
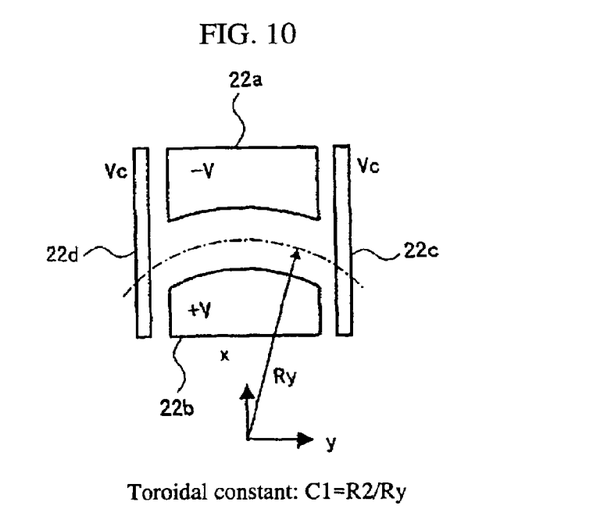
FIG. 10 is a drawing showing the fan-type toroidal electrode shape on the present monochromator.

A specific method for adjusting the parameters of the sectorial toroidal electrical field is described while referring to FIG. 10. By making the electrical field into a toroidal electrical field, a convergence effect is generated in the y-direction. Two adjustment terminals 22c and 22d are installed in the y-direction for making fine adjustments to the toroidal electrical field. Applying the same voltage Vc to these electrodes makes tiny changes in the toroidal constant, for changing the y-direction convergence point. The focus point can also be adjusted in the y-direction, not only in the x-direction.

The electrodes 22a, 22b that comprise the sectorial toroidal electrical field of the present embodiment have a curvature along the electron beam trajectory. These electrodes 22a, 22b further have a shape with a particular curvature radius Ry along the y-direction of their cross section. Electrodes shaped in this way can generate a convergence effect in the y-direction.

These electrodes 22a, 22b and the adjusting electrodes 22c, 22d are respectively connected to a variable power supply (not shown in drawing).

Second Embodiment

Figure 11:
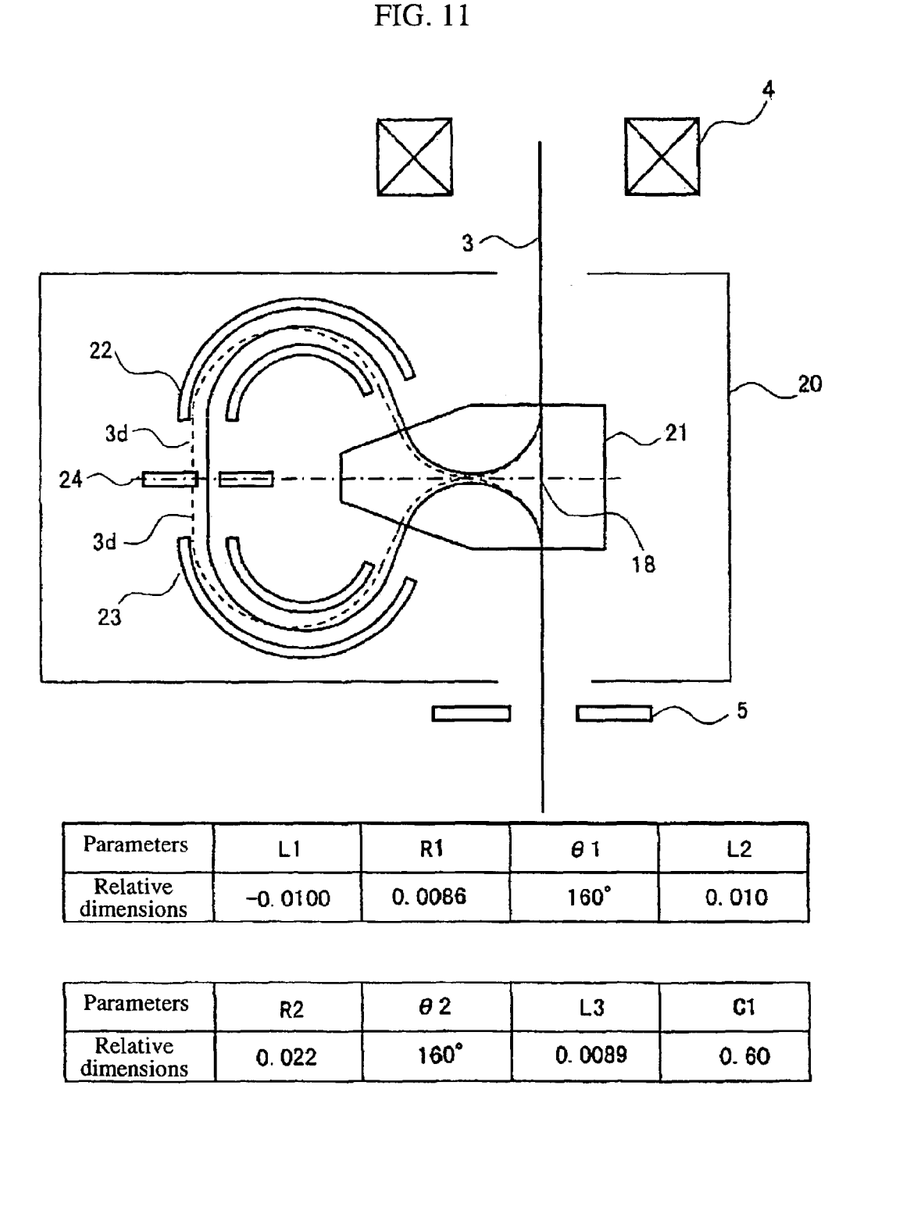
FIG. 11 is a graph showing the track of the monochromator for describing the second embodiment of the present invention.

The second embodiment of the invention is described next. The energy dispersion trajectory 3d is shown in FIG. 11. The energy dispersion trajectory is emitted at the point in time that the first sectorial magnetic field formed by the magnetic field generator 21 is irradiated. This becomes uniform after passing the first sectorial electrical field formed by the first electrical field generator 22 and passes through the beam restrictor 24. After then passing along the mirror-symmetrical trajectory, the energy dispersion diminishes and becomes completely zero at the point of emission from the sectorial magnetic field formed by the magnetic field generator 21. Even after emission, the energy dispersion of the electron beam 3d remains unchanged at zero. Summing the above, since the energy dispersion along the linear optical axis is always zero, the beam is subjected to point convergence and triple convergence from energy non-dispersion regardless of the point convergence position. The optical parameters for this kind of completely monochrome conditions are summarized in the lower half of FIG. 11. In a monochromator configured with these values, even if the convergent point position has shifted from a change in the parameters due to other optical elements on the optical axis, stable monochrome conditions can always be restored and, thus, it is easy to adjust the device.

Figure 12:
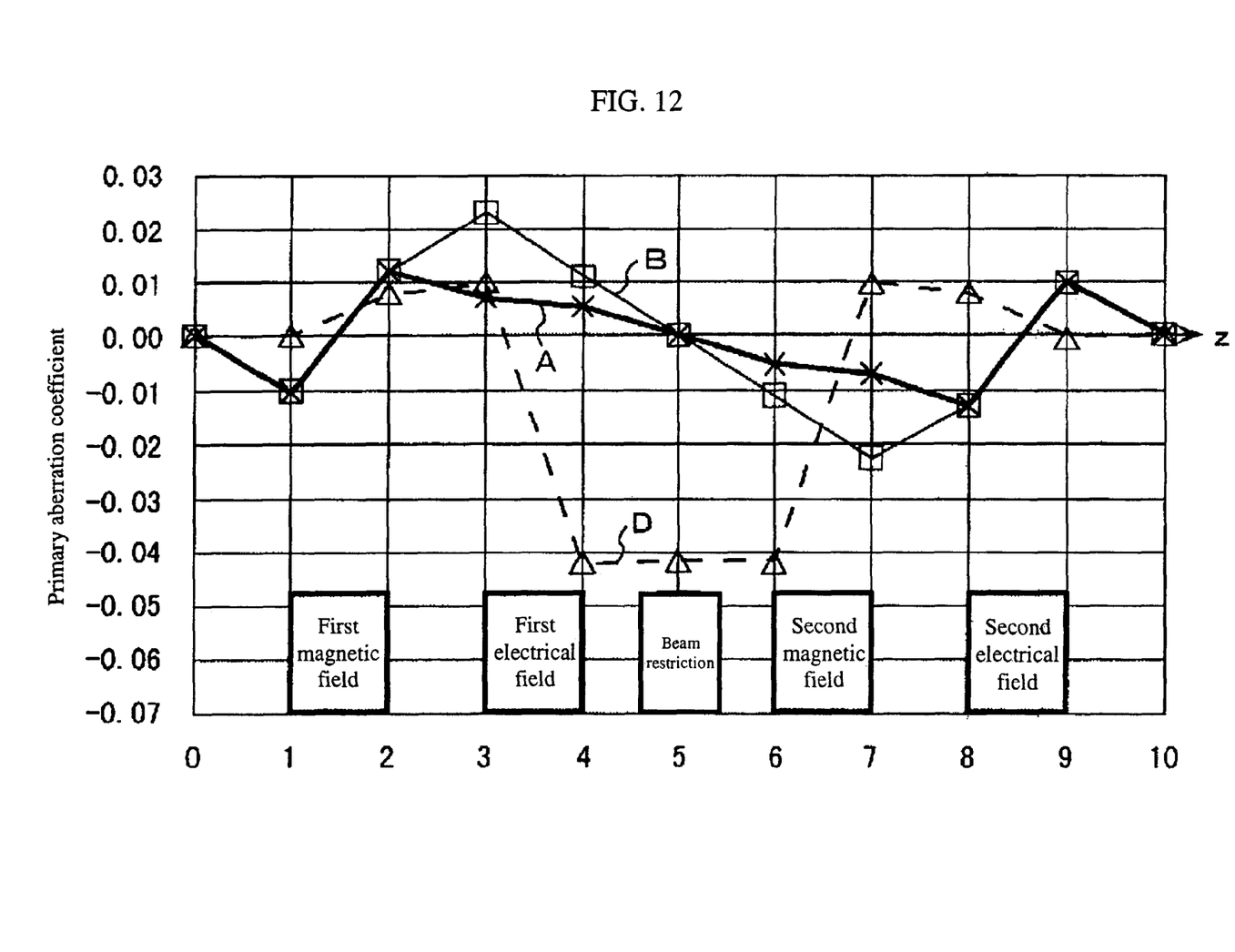
FIG. 12 is a graph showing the primary aberration coefficient of the monochromator for describing the second embodiment.
Figure 13:
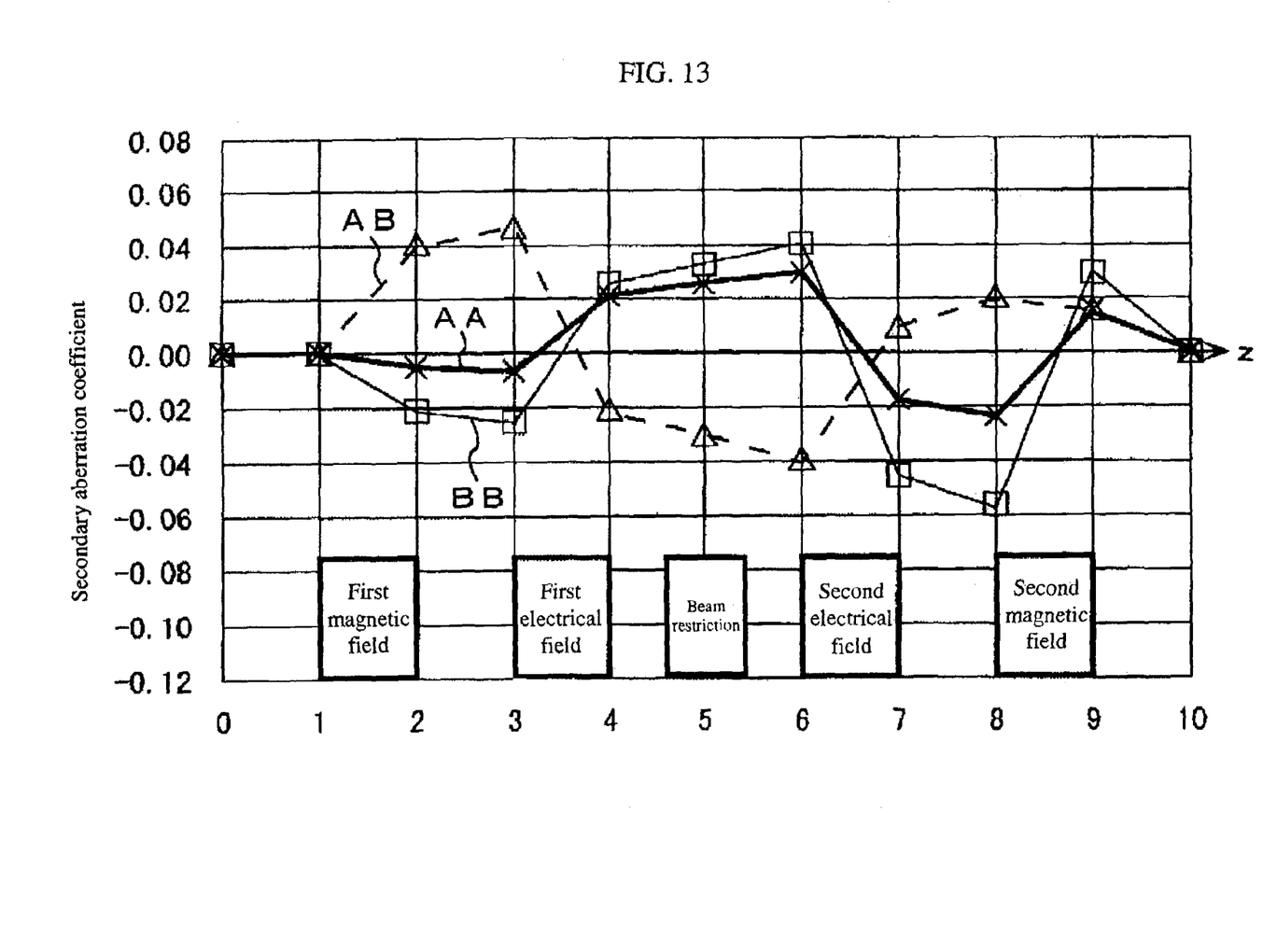
FIG. 13 is a graph showing the secondary aberration coefficient of the monochromator for describing the second embodiment.

The changes in the aberration coefficients when the above parameters were set are shown in FIG. 12 and FIG. 13. As FIG. 12 clearly shows, while the aberration coefficient A for the x direction open angle α of and the aberration coefficient B for the y direction of open angle β are simultaneously converged (A=B=0) on the beam restrictor 24 position (5), the energy dispersion coefficient D is reaching −0.04 the same as in the previous embodiment. Simultaneous convergence is taking place in the x direction and y direction at the monochrome convergence point on the right end (10). Furthermore, the dispersion is canceled out immediately after emission from the fan shaped magnetic field. The monochromator of the present invention is in this way triple-converged (A=B=D=0) in the primary formula for the trajectory calculation, both in terms of space and energy. It should be noted in particular that D is always at zero from the emission point (9) of the sectorial magnetic field onwards. Further, in the secondary aberration coefficient changes as shown in FIG. 13, the three aberration coefficients are all eliminated (AA=BB=0) at the monochrome point on the right end (10). This is the effect of mirror symmetry at the monochromator slit position (5), and the perpendicular input of the beam perpendicular to the plane of the sectorial magnetic field.

The embodiments of the present invention allow high resolution in a low acceleration SEM where it was previously impossible to obtain a resolution within 2 nanometers. Though Schottky emission electron sources and thermal field emission electron sources offered superior characteristics in terms of continuous stable operation over several thousand hours, these devices had the problem that energy width was relatively large at approximately 0.6 eV and also large problems with chromatic aberrations compared to cooled-cathode discharge electron sources. However, both long term stable operation and reduced chromatic aberrations can be achieved by utilizing the monochromator described in the present embodiments.

The example in the embodiments of the present invention described a scanning electron microscope (SEM) using a monochromator at a low acceleration voltage. However, the present invention may also be applied to scanning transmission type electron microscopes (STEM) and high acceleration scanning electron microscopes.

As described above, by installing the monochromator of the embodiment of the present invention in a scanning electron microscope, a monochromatized convergence or focus point can be obtained for all primary and secondary aberration coefficients converged after limiting the beam energy with slits. By setting this point as the object point for the focus lens and reducing it with the objective lens, an extremely tiny spot with few chromatic aberrations can be obtained and the resolution of the SEM improved.

There is also absolutely no need to change optical conditions other than for the monochromator either before or after monochromator operation so that high reliability along with simple maintenance is achieved making the invention particularly effective for use on semiconductor device production lines.

The invention as described above, renders the effect of achieving high image resolution while suppressing the generation of higher-order aberrations without lowering the beam focusing effect.

What is claimed is:

1. A monochromator comprising:
a magnetic field generator having an input beam surface which is substantially perpendicular to an input direction of an electron beam emitted from an electron source; and
an electrical field generator to focus the electron beam passing through a magnetic field generated by the magnetic field generator on the direction of a magnetic line of the magnetic field.

2. The monochromator according to claim 1, further comprising:
a prestage deflection system;
a final deflection system which is installed on a mirror symmetrical position to the prestage deflection system; and,
a slit which is installed in a mirror symmetrical surface between the prestage and final deflection systems,
wherein each of the prestage deflection system and the final deflection system includes the magnetic field generator and the electrical field generator.

3. The monochromator according to claim 1, further comprising:
a prestage deflection system;
a final deflection system which is installed on a mirror symmetrical position to the prestage deflection system; and
a slit which is installed in a mirror symmetrical surface between the prestage and final deflection systems,
wherein each of the prestage deflection system and the final deflection system includes the magnetic field generator and the electrical field generator and wherein the final deflection system cancels out an energy dispersion of the electron beam generated in the prestage deflection system.

4. A scanning electron microscope having the monochromator according to claim 1, wherein an electrode included in the electrical field generator forms a fan shape.

5. A scanning electron microscope having the monochromator according to claim 1, wherein a magnetic pole included in the magnetic field generator has input and output beam surfaces perpendicular to the electron beam.

6. A scanning electron microscope having an objective lens which focus an electron beam emitted from an electron source on a sample, comprising:
a monochromator having a magnetic field generator and an electrical field generator between the electron source and the objective lens,
wherein the electron beam enters at an angle substantially perpendicular to an input beam surface of the magnetic field generator and wherein the electron beam passing through a magnetic field generated by the magnetic field generator focuses on the direction of a magnetic line of the magnetic field due to the electric field generator.

7. The scanning electron microscope according to claim 6, wherein the electron beam is deflected by the magnetic field generated by the magnetic filed generator and wherein an electrical field generated by the electrical field generator deflects the electron beam passing though the magnetic field to disperse an energy of the beam.

8. The scanning electron microscope according to claim 6, wherein the monochromator comprises a prestage deflection system, a final deflection system which is installed on a mirror symmetrical position to the prestage deflection system and a slit which is installed in a mirror symmetrical surface between the prestage and final deflection systems, wherein each of the prestage deflection system and the final deflection system includes the magnetic field generator and the electrical field generator and wherein the final deflection system cancels out an energy dispersion of the electron beam generated in the prestage deflection system.

9. The scanning electron microscope according to claim 6, wherein the monochromator is installed between first and second focusing lenses each for focusing the electron beam and wherein an excitation condition of the first and second focusing lenses does not change before and after the alternation of an excitation of the magnetic field generator.

10. The scanning electron microscope according to claim 6, wherein an electrode included in the electrical field generator forms a fan shape.

11. The scanning electron microscope according to claim 6, wherein a magnetic pole included in the magnetic field generator has input and output beam surfaces perpendicular to the electron beam.

12. The scanning electron microscope according to claim 6, wherein the monochromator comprises a prestage deflection system, a final deflection system which is installed on a mirror symmetrical position to the prestage deflection system and a slit which is installed in a mirror symmetrical surface between the prestage and final deflection systems, wherein each of the prestage deflection system and the final deflection system includes the magnetic field generator and the electrical field generator and wherein after the prestage deflection system spatially converges the electron beam at the position of the slit and limits and energy width by the slit, the final deflection stage spatially converges the electron beam again and cancels out an energy dispersion of the electron beam.

13. A monochromator comprising:
a magnetic field generator having two magnetic poles facing each other and an input beam surface which is substantially perpendicular to an input direction of an electron beam emitted from an electron source; and
an electrical field generator to focus the electron beam passing through a magnetic field generated by the magnetic field generator on the facing direction of the two magnetic poles.

14. The monochromator according to claim 13, further comprising:
a prestage deflection system;
a final deflection system which is installed on a mirror symmetrical position to the prestage deflection system; and
a slit which is installed in a mirror symmetrical surface between the prestage and final deflection systems,
wherein each of the prestage deflection system and the final deflection system includes the magnetic field generator and the electrical field generator.

15. The monochromator according to claim 13, further comprising:
a presage deflection system;
a final deflection system which is installed on a mirror symmetrical position to the prestage deflection system; and
a slit which is installed in a mirror symmetrical surface between the prestage and final deflection systems,
wherein each of the prestage deflection system and the final deflection system includes the magnetic field generator and the electrical field generator and wherein the final deflection system cancels out an energy dispersion of the electron beam generated in the prestage deflection system.

16. A scanning electron microscope having the monochromator according to claim 13, wherein an electrode included in the electrical field generator forms a fan shape.

17. A scanning electron microscope having the monochromator according to claim 13, wherein a magnetic pole included in the magnetic field generator has input and output beam surfaces perpendicular to the electron beam.

* * * * *